(12) United States Patent
Risaki

(10) Patent No.: US 8,193,060 B2
(45) Date of Patent: Jun. 5, 2012

(54) METHOD OF MANUFACTURING A SEMICONDUCTOR DEVICE

(75) Inventor: Tomomitsu Risaki, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/949,434

(22) Filed: Nov. 18, 2010

(65) Prior Publication Data

US 2011/0065247 A1     Mar. 17, 2011

Related U.S. Application Data

(62) Division of application No. 12/392,491, filed on Feb. 25, 2009, now Pat. No. 7,859,049.

(30) Foreign Application Priority Data

Feb. 27, 2008 (JP) ................................ 2008-046370

(51) Int. Cl.
    *H01L 21/336* (2006.01)
(52) U.S. Cl. ........ 438/270; 438/276; 438/290; 257/329; 257/339
(58) Field of Classification Search .............. 438/270, 438/276, 290; 257/329, 330, 331, 339, E29.262
    See application file for complete search history.

(56) References Cited

U.S. PATENT DOCUMENTS

| | | | |
|---|---|---|---|
| 5,701,026 A | 12/1997 | Fujishima et al. | 257/510 |
| 6,018,176 A | 1/2000 | Lim | 257/302 |
| 6,140,147 A * | 10/2000 | Murakami et al. | 438/79 |
| 7,470,960 B1 | 12/2008 | Sugawara | 257/401 |
| 7,902,596 B2 * | 3/2011 | Kitamura et al. | 257/329 |
| 2002/0179928 A1 | 12/2002 | Fujishima | 257/163 |
| 2005/0161734 A1 | 7/2005 | Miyata et al. | 257/330 |
| 2007/0032029 A1 | 2/2007 | Chow et al. | 438/330 |
| 2007/0241330 A1 | 10/2007 | Nishimura et al. | 257/48 |
| 2008/0173876 A1 | 7/2008 | Ueno | 257/77 |

FOREIGN PATENT DOCUMENTS

JP         1-310576 A       12/1989

OTHER PUBLICATIONS

European Search Report for related European Application No. 09153700.1, dated Sep. 15, 2009, 11 pages.
Fujishima, Naoto et al., A trench lateral power MOSFET using self-aligned trench bottom Canada, Electron Devices Meeting, 1997, 4 pages.

* cited by examiner

*Primary Examiner* — Phuc Dang
(74) *Attorney, Agent, or Firm* — Brinks Hofer Gilson & Lione

(57) ABSTRACT

Provided is a method for manufacturing a semiconductor device. A well region formed on a semiconductor substrate includes a plurality of trench regions, and a source electrode is connected to a source region formed on a substrate surface between the trench regions. Adjacently to the source region, a high concentration region is formed, which is brought into butting contact with the source electrode together with the source region, whereby a substrate potential is fixed. A drain region is formed at a bottom portion of the trench region, whose potential is taken to the substrate surface by a drain electrode buried inside the trench region. An arbitrary voltage is applied to a gate electrode, and the drain electrode, whereby carriers flow from the source region to the drain region and the semiconductor device is in an on-state.

5 Claims, 3 Drawing Sheets

METHOD OF MANUFACTURING A SEMICONDUCTOR DEVICE

RELATED APPLICATIONS

This application is a divisional of U.S. patent application Ser. No. 12/392,491, issued as U.S. Pat. No. 7,859,049, filed Feb. 25, 2009, which claims priority under 35 U.S.C. §119 to Japanese Patent Application No. JP2008-046370 filed on Feb. 27, 2008, the entire content of each of which is hereby incorporated by reference.

BACKGROUND OF THE INVENTION

1. Field of the Invention

The present invention relates to a semiconductor device and a method of manufacturing a semiconductor device, for example, a metal oxide semiconductor (MOS) transistor.

2. Description of the Related Art

With full use of a microfabrication technology, with times, it becomes possible to manufacture semiconductor devices while achieving downsizing without decreasing performance thereof. This tendency is also found in semiconductor elements having high driving performance, and hence a reduction in on-resistance per unit area has been pursued by making full use of the microfabrication technology. However, in fact, a lowering of a withstanding voltage, which is caused by miniaturization of elements, hinders further enhancement of the driving performance owing to the microfabrication technology. In order to overcome the trade-off between the miniaturization and the withstanding voltage, there have been proposed elements having various structures, and the trench gate MOS transistor can be nominated as a mainstream structure at present in the field of power MOS field effect transistors (FETs) having a high withstanding voltage and high driving performance.

Among doubled-diffused MOS (DMOS) transistors having a high withstanding voltage and high driving performance, the trench gate MOS transistor has the highest scale in integration (for example, see JP 01-310576 A).

The trench gate MOS transistor shows extremely excellent performance as an element itself, however it is disadvantageous when being mounted on a chip together with other semiconductor elements since the trench gate MOS transistor has a vertical MOS structure, in which current flows in a depth direction of a substrate, and an entire rear surface of a semiconductor substrate is an electrode.

SUMMARY OF THE INVENTION

The present invention has an object to provide a semiconductor device having a low on-resistance, which is capable of being mounted on a chip together with other semiconductor elements.

(1) According to the present invention, there is provided a semiconductor device including: a first conductivity type well region formed on a surface of a semiconductor substrate at an arbitrary depth; a plurality of trench regions formed at a depth smaller than the predetermined depth of the first conductivity type well region; a gate electrode disposed on a side surface of each the plurality of trench regions via a gate insulating film and brought into contact with the gate insulating film; a second conductivity type drain region formed in a bottom portion of each of the plurality of trench regions; a second conductivity type source region formed in a part of a region, which is formed between the plurality of trench regions, of the surface of the semiconductor substrate; and a first conductivity type high concentration region formed in a part of a region, which is formed between the plurality of trench regions, of the surface of the semiconductor substrate.

(2) A semiconductor device according to item (1) further includes a second conductivity type low concentration diffusion region formed between the semiconductor substrate and the first conductivity type well region to surround the second conductivity type drain region.

(3) According to the present invention, there is provided a method of manufacturing a semiconductor device including: forming a first conductivity type well region on a semiconductor substrate; forming a plurality of trench regions at a depth smaller than a depth of the first conductivity type well region; forming a gate insulating film; forming a gate electrode film; removing, by anisotropic etching, the gate insulating film and the gate electrode film formed on a bottom portion of each of the plurality of trench regions and a part of the gate insulating film and the gate electrode film formed on a surface of the semiconductor substrate between two of the plurality of trench regions; forming an interlayer insulating film; removing, by etching, a part of the interlayer insulating film formed on the gate electrode film, a part of the interlayer insulating film formed on the bottom portion of each of the plurality of trench regions, and a part of the interlayer insulating film formed on the surface of the semiconductor substrate between two of the plurality of trench regions; forming a metal film; and etching a part of the metal film.

(4) A method of manufacturing a semiconductor device according to item (3) further includes forming a second conductivity type low concentration diffusion region.

(5) A method of manufacturing a semiconductor device according to item (3) further includes performing an epitaxial growth.

According to the present invention, the drain electrode is drawn from the inside of the trench and therefore the drain electrode can be taken from the surface of the semiconductor substrate, whereby on-chip mounting with other semiconductor elements can be achieved with ease.

DETAILED DESCRIPTION OF THE PREFERRED EMBODIMENTS (1) Outline of Embodiment

Figure 1A:
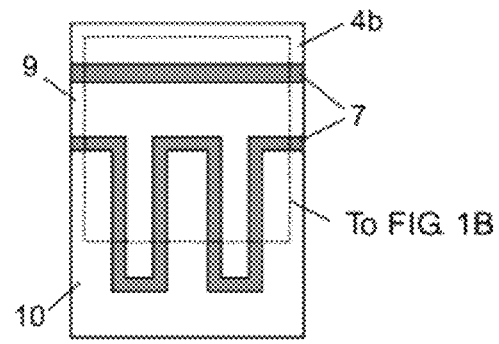
FIGS. 1A and 1B are views for describing a structure of a semiconductor device according to an embodiment of the present invention.
Figure 1B:
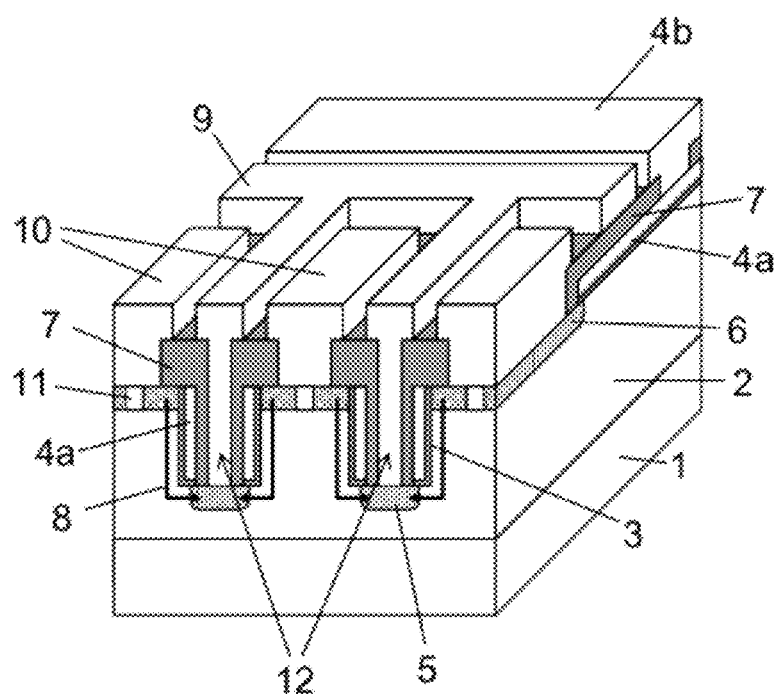

FIGS. 1A and 1B illustrate a structure of a semiconductor device according to an embodiment of the present invention. FIG. 1A is a top view, and FIG. 1B is a bird's-eye view and is cut out along a dotted-line portion of FIG. 1A.

A plurality of trench regions 12 are formed in a first conductivity type well region 2 formed on a semiconductor substrate 1. A source electrode 10 has an ohmic contact with a second conductivity type source region 6 formed on a substrate surface between the trench regions 12. Adjacently to the second conductivity type source region 6, there is formed a first conductivity type high concentration region 11, which is brought into butting contact with the source electrode 10 together with the second conductivity type source region 6, whereby a substrate potential is fixed.

A second conductivity type drain region 5 is formed at a bottom portion of the trench region 12, and a potential is taken to the substrate surface by a drain electrode 9 buried inside the trench region 12.

An arbitrary voltage is applied to the drain electrode 9 and a gate electrode 4b made of metal which is connected to a gate electrode 4a formed continuously over a flat region on an outer side of the trench region 12 and a side wall inside the trench region 12, whereby carriers flow from the second conductivity type source region 6 to the second conductivity type drain region 5 in a direction indicated with an arrow 8, bringing the semiconductor device into an on-state.

Specifically, as in a trench MOS transistor, a gate length extends in a direction perpendicular to the surface of the semiconductor substrate, and hence an area efficiency is excellent compared with a planar type MOS transistor, resulting in enhancement of driving performance per unit area. Further, all the electrodes are exposed to the surface of the semiconductor substrate, and therefore on-chip mounting with other elements, which has been difficult to be achieved in the trench MOS transistor, is realized with ease.

Next, a method of manufacturing the semiconductor device is described.

FIGS. 2A to 2F are bird's-eye views of a process flow, illustrating the method of manufacturing the semiconductor device according to the basic embodiment of the present invention illustrated in FIGS. 1A and 1B.

Figure 2A:
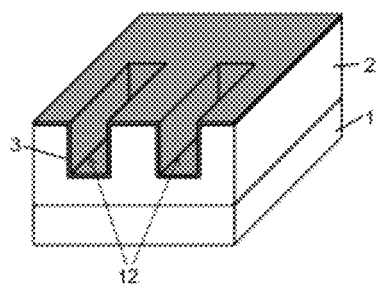
FIGS. 2A to 2F are views for describing a method of manufacturing the semiconductor device according to the embodiment of the present invention.

First, as illustrated in FIG. 2A, the first conductivity type well region 2 is formed on the semiconductor substrate 1 and then the trench regions 12 are formed in the first conductivity type well region 2 at a depth smaller than that of the first conductivity type well region 2. After that, thermal oxidation is performed to form a gate oxide film 3 on the substrate surface and inside the trench regions 12.

Figure 2B:
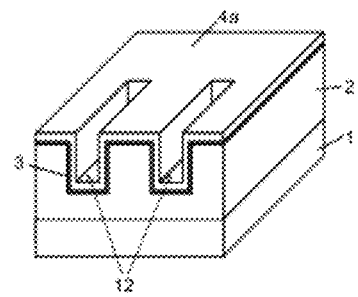
Figure 2C:
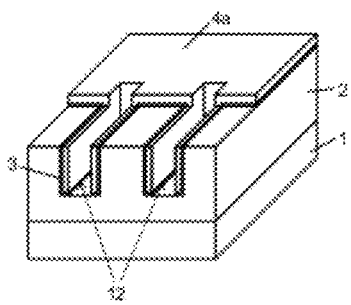

Next, as illustrated in FIG. 2B, the gate electrode film 4a is deposited on the gate oxide film 3 and, as illustrated in FIG. 2C, the gate electrode film 4a and the gate oxide film 3 are partially removed by highly anisotropic dry etching. In this case, as to the substrate surface and a trench bottom surface included in a region to be etched, the gate electrode film 4a and the gate oxide film 3 are all removed, but the gate electrode film 4a and the gate oxide film 3 deposited on a trench side wall are not removed by highly anisotropic dry etching.

Figure 2D:
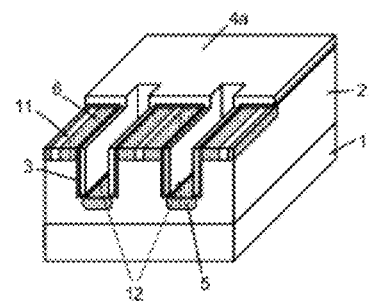

As illustrated in FIG. 2D, second conductivity type impurities are ion-implanted into a region excluding a region in which the first conductivity type high concentration region 11 is formed so that the second conductivity type drain region 5 and the second conductivity type source region 6 are formed in a self-aligning manner. After that, the region excluding the region in which the first conductivity type high concentration region 11 is formed is masked with a resist or the like, whereby the first conductivity type high concentration region 11 is formed by ion-implantation or the like.

Figure 2E:
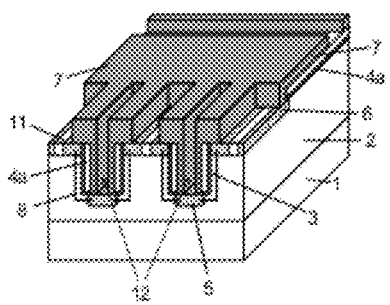

Next, as illustrated in FIG. 2E, an interlayer insulating film 7 is deposited. Thereafter, the interlayer insulating film 7 is subjected to selective etching in a part of regions of the second conductivity type drain region 5, the second conductivity type source region 6, the first conductivity type high concentration region 11, and the gate electrode 4a to thereby form openings.

Figure 2F:
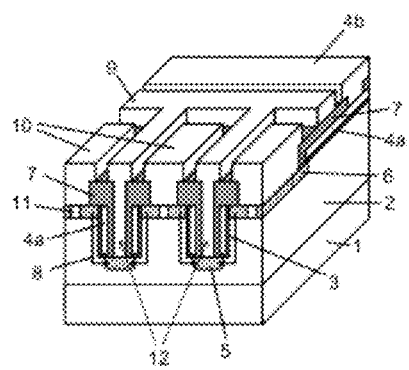

Finally, as illustrated in FIG. 2F, metal is deposited to be arbitrarily patterned, whereby the gate electrode 4b, the drain electrode 9, and the source electrode 10 are formed.

Modification Example

In this modification example, an electric field relaxation region is formed in a drain region, whereby a withstanding voltage of a semiconductor device is enhanced.

Figure 3:
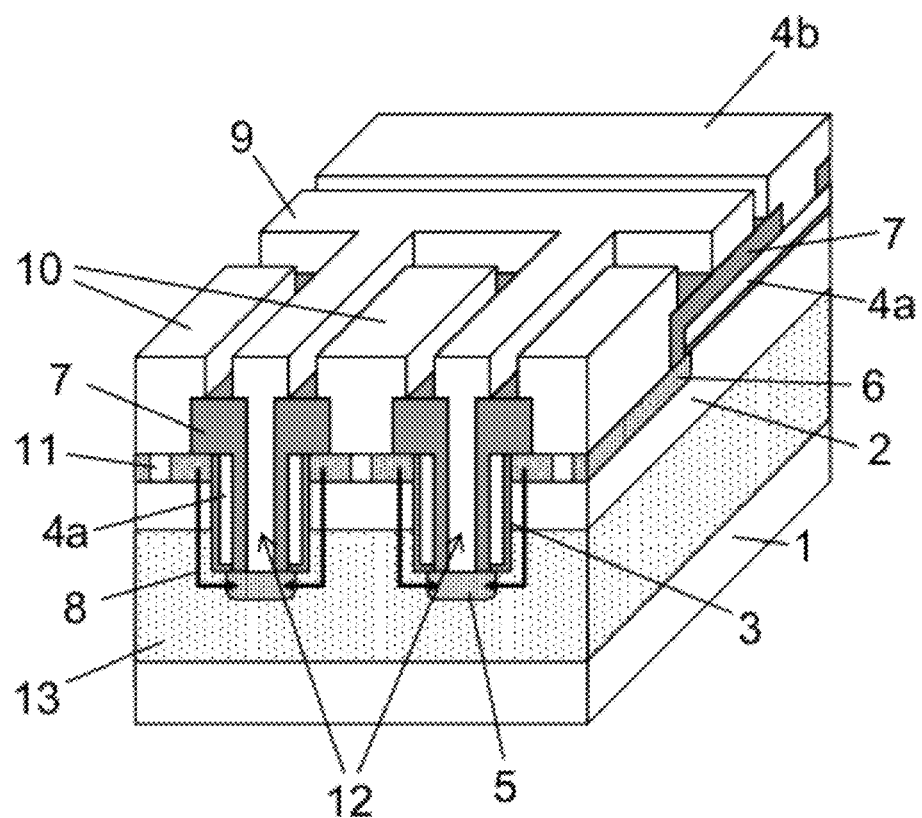
FIG. 3 is a view for describing a modification example of the semiconductor device according to the embodiment of the present invention.

FIG. 3 is a conceptual view of the modification example. FIG. 3 illustrates a structure in which, in the basic structure of FIGS. 1A and 1B, a second conductivity type low concentration diffusion region 13 is formed between the semiconductor substrate 1 and the first conductivity type well region 2. This structure is realized by a manufacturing method such as a double diffusion or an epitaxial growth.

As described above, the second conductivity type low concentration diffusion region 13 is formed, whereby an electric field applied to a drain can be mitigated and a drain withstanding voltage can be enhanced.

In this case, the second conductivity type drain region 5 is set so as to be within the second conductivity type low concentration diffusion region 13, and a impurity concentration of the second conductivity type low concentration diffusion region 13 and a distance between the deepest bottom portion of the trench region 12 and a bottom portion of the first conductivity type well region 2 are arbitrarily adjusted based on a target withstanding voltage.

Note that, in FIGS. 1A and 1B, 2A to 2F, and 3, the first conductivity type is set to p-type, and the second conductivity type is set to n-type, whereby the n-channel MOS transistor is described. When the first conductivity type is set to n-type and the second conductivity type is set to p-type, this transistor functions as a p-channel MOS transistor.

What is claimed is:

1. A method of manufacturing a semiconductor device, comprising:
    forming a first conductivity type well region above a semiconductor substrate;
    forming a plurality of trench regions at a depth smaller than a depth of the first conductivity type well region;
    forming a gate insulating film;
    forming a gate electrode film;
    removing, by anisotropic etching, the gate insulating film and the gate electrode film formed on a bottom portion of each of the plurality of trench regions and a part of the gate insulating film and the gate electrode film formed on a surface of the semiconductor substrate between two of the plurality of trench regions;
    forming a second conductivity type drain region at a part of a bottom of each of the plurality of trench regions such that a width of the drain region is less than a width of the trench region;
    forming an interlayer insulating film;
    removing, by etching, a part of the interlayer insulating film formed on the gate electrode film, a part of the interlayer insulating film formed on the bottom portion of each of the plurality of trench regions, and a part of the interlayer insulating film formed on the surface of the semiconductor substrate between two of the plurality of trench regions;
    forming a metal film; and
    etching a part of the metal film.

2. A method of manufacturing a semiconductor device according to claim 1, wherein second conductivity type drain region is formed such that lateral sides of the drain region are apart from corresponding sides of the trench region by at least a thickness of the gate insulating film.

3. A method of manufacturing a semiconductor device according to claim 2, further comprising forming, before the forming the first conductivity type well region on the semiconductor substrate, a second conductivity type low concentration diffusion region on the semiconductor substrate, wherein the second conductivity type drain region is formed within the second conductivity type low concentration diffusion region such that the second conductivity type low concentration diffusion region surrounds the second conductivity type drain region.

4. A method of manufacturing a semiconductor device, comprising:
   forming a first conductivity type low concentration diffusion region on a semiconductor substrate;
   forming a second conductivity type well region on the first conductivity type low concentration diffusion region such that the first conductivity type low concentration diffusion region is between the semiconductor substrate and the second conductivity type well region;
   forming a plurality of trench regions at a depth smaller than a depth of the second conductivity type well region;
   forming a gate insulating film;
   forming a gate electrode film;
   removing, by anisotropic etching, the gate insulating film and the gate electrode film formed on a bottom portion of each of the plurality of trench regions and a part of the gate insulating film and the gate electrode film formed on a surface of the semiconductor substrate between two of the plurality of trench regions;
   forming an interlayer insulating film;
   removing, by etching, a part of the interlayer insulating film formed on the gate electrode film, a part of the interlayer insulating film formed on the bottom portion of each of the plurality of trench regions, and a part of the interlayer insulating film formed on the surface of the semiconductor substrate between two of the plurality of trench regions;
   forming a metal film; and
   etching a part of the metal film.

5. A method of manufacturing a semiconductor device according to claim 4, wherein the forming the first conductivity type low concentration diffusion region on the entire surface of the region on which the transistor is formed comprises an epitaxial growth.

* * * * *